(12) United States Patent
Yamada et al.

(10) Patent No.: US 10,470,315 B2
(45) Date of Patent: Nov. 5, 2019

(54) MANUFACTURING METHOD OF TEST SOCKET AND TEST METHOD FOR SEMICONDUCTOR PACKAGE

(71) Applicant: Samsung Electronics Co., Ltd., Suwon-si, Gyeonggi-do (KR)

(72) Inventors: Daisuke Yamada, Asan-si (KR); Jae-ho Song, Cheonan-si (KR); Young-gi Min, Asan-si (KR); Dong-uhn Shin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 408 days.

(21) Appl. No.: 15/259,352

(22) Filed: Sep. 8, 2016

(65) Prior Publication Data

US 2017/0118846 A1    Apr. 27, 2017

(30) Foreign Application Priority Data

Oct. 21, 2015   (KR) .......................... 10-2015-0146665

(51) Int. Cl.
*H01R 43/00*     (2006.01)
*H05K 13/00*     (2006.01)
(Continued)

(52) U.S. Cl.
CPC .......... *H05K 3/4007* (2013.01); *G01R 1/0441* (2013.01); *G01R 1/0466* (2013.01);
(Continued)

(58) Field of Classification Search
CPC .......... H05K 3/4007; H05K 3/32; H05K 3/26; H05K 1/092; G01R 1/0441; G01R 31/28;
(Continued)

(56) References Cited

U.S. PATENT DOCUMENTS 5,925,931 A * 7/1999 Yamamoto .......... H01L 23/3114
257/737
6,422,879 B2   7/2002 Fujimura
(Continued)

FOREIGN PATENT DOCUMENTS

JP   2001-237039 A   8/2001
KR   10-1204941 B1   11/2012

*Primary Examiner* — Donghai D Nguyen
(74) *Attorney, Agent, or Firm* — Harness, Dickey & Pierce, P.L.C.

(57) ABSTRACT

Configuring a test socket to electrically couple a semiconductor package to a test device includes preparing a test socket including a base material and a first conductive portion included in the base material. The first conductive portion may extend in a thickness direction of the base material. Configuring the test socket may include forming a second conductive portion including conductive ink on the first conductive pattern. The second conductive portion may be formed based on printing conductive ink on the first conductive portion. The configuring may include forming the second conductive portion to repair the test socket. The first conductive portion may be degraded such that a top surface of the first conductive portion includes a surface depression. The second conductive portion may fill the surface depression. The first and second conductive portions may be integral with each other.

18 Claims, 11 Drawing Sheets

(51) Int. Cl.
    *H05K 3/40*         (2006.01)
    *G01R 1/04*         (2006.01)
    *G01R 3/00*         (2006.01)
    *G01R 31/28*       (2006.01)
    *H05K 1/09*         (2006.01)
    *H05K 3/26*         (2006.01)
    *H05K 3/32*         (2006.01)

(52) U.S. Cl.
    CPC ............... *G01R 3/00* (2013.01); *G01R 31/28* (2013.01); *H05K 1/092* (2013.01); *H05K 3/26* (2013.01); *H05K 3/32* (2013.01)

(58) Field of Classification Search
    CPC ... G01R 3/00; G01R 1/0466; Y10T 29/49147; Y10T 29/49155; Y10T 29/49165
    USPC .................... 29/842, 846, 852, 854; 174/262
    See application file for complete search history.

(56) References Cited

U.S. PATENT DOCUMENTS

| | | |
|---|---|---|
| 6,574,114 B1 * | 6/2003 | Brindle .............. G02B 6/12007 |
| | | 174/262 |
| 7,267,559 B2 | 9/2007 | Hashitani et al. |
| 7,621,044 B2 | 11/2009 | Eldridge et al. |
| 8,334,595 B2 | 12/2012 | Jung |
| 8,610,447 B2 | 12/2013 | Lee |
| 8,939,784 B2 | 1/2015 | Lee et al. |
| 2007/0007983 A1 | 1/2007 | Salmon |
| 2013/0285692 A1 | 10/2013 | Lee |
| 2014/0353013 A1 | 12/2014 | Zhao et al. |
| 2014/0356584 A1 | 12/2014 | Yang et al. |

* cited by examiner

II   II'

MANUFACTURING METHOD OF TEST SOCKET AND TEST METHOD FOR SEMICONDUCTOR PACKAGE

CROSS-REFERENCE TO RELATED APPLICATION

This application claims the benefit of Korean Patent Application No. 10-2015-0146665, filed on Oct. 21, 2015, in the Korean Intellectual Property Office, the disclosure of which is incorporated herein in its entirety by reference.

BACKGROUND

The inventive concepts relate to test sockets for testing semiconductor packages and testing semiconductor packages by using test sockets.

To test a semiconductor package, an electrical connection between the semiconductor package and a test device may be provided by a test socket. The test socket may include an insulating matrix having elasticity and a conductive material surrounded by the inside of the insulating matrix. The conductive material may establish an electrical connection between the semiconductor package and a test device.

In some cases, manufacturing costs of test sockets for testing semiconductor packages have increased with increasing fineness of the semiconductor packages. In some cases, lifetimes of test sockets for testing semiconductor packages have decreased with increasing fineness of the semiconductor packages.

SUMMARY

Some example embodiments of the inventive concepts provide test sockets having increased lifespan. Some example embodiments of the inventive concepts provide methods of manufacturing test sockets having increased lifespan.

Some example embodiments of the inventive concepts provide methods of testing semiconductor packages by using the test sockets having increased lifespan.

According to some example embodiments, a method of manufacturing a test socket may include preparing a test socket, the test socket including a base material and a first conductive portion in the base material, the first conductive portion extending in a thickness direction of the base material. The method may include forming a second conductive portion including conductive ink on the first conductive portion.

The first conductive portion may include a top surface, the top surface of the first conductive portion may include a surface depression, and the method may further include forming the second conductive portion based on filling the surface depression with the conductive ink.

The method may include cleaning the top surface of the first conductive portion prior to forming the second conductive portion on the first conductive portion.

The second conductive portion may include a top surface, and the top surface of the second conductive portion may include a concave portion.

The second conductive portion may include a top surface, and the top surface of the second conductive portion may include an uneven portion.

The method may include forming the second conductive portion based on operating a three-dimensional (3D) printer.

The method may include forming the second conductive portion such that a top surface of the second conductive portion is elevated relative to a top surface of the base material.

The base material may include an insulating elastic material, and the first conductive portion may include a plurality of conductive particles, the plurality of conductive particles being configured to display conductivity in the thickness direction of the base material.

The method may include forming the first conductive portion based on printing conductive ink on the base material.

The first conductive portion may include an upper pad on the base material, a lower pad under the base material, and a conductive wire connected to the upper pad and the lower pad, such that the upper pad and the lower pad are connected through the conductive wire.

According to some example embodiments, a method of testing a semiconductor package may include preparing a test socket, the test socket including a base material and a first conductive pattern in the base material, the base material including an insulating elastic material, the first conductive portion extending in a thickness direction of the base material. The method may include forming a second conductive portion including conductive ink on the first conductive portion. The method may include placing the test socket on a test substrate, and placing a semiconductor package on the test socket such that a connection terminal of the semiconductor package contacts at least a portion of the second conductive portion.

The second conductive portion may be between the connection terminal and the first conductive portion, and the second conductive portion may electrically connect the connection terminal and the first conductive portion to each other.

The method may include cleaning a top surface of the first conductive portion before forming the second conductive portion on the first conductive portion.

Forming the second conductive portion may include at least one of forming a concave portion in a central area of the second conductive portion top surface, and forming an uneven portion of the second conductive portion top surface.

The method may include forming the second conductive portion based on operating a three-dimensional (3D) printer.

According to some example embodiments, a method may include configuring a test socket to electrically couple a semiconductor package to a test device, the test socket including a base material and a first conductive portion on a top surface of the base material, the first conductive portion at least partially defining a cavity between a bottom surface of the first conductive portion and the top surface of the base material. The configuring may include forming a second conductive portion including conductive ink on a top surface of the first conductive portion.

The first conductive portion may include a conductive ink material, such that the first and second conductive portions are integral with each other.

The method may include cleaning the top surface of the first conductive portion prior to applying the conductive ink on the first conductive portion.

The top surface of the second conductive portion may include a concave portion.

The top surface of the second conductive portion may include an uneven portion.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF THE EMBODIMENTS

Figure 1:
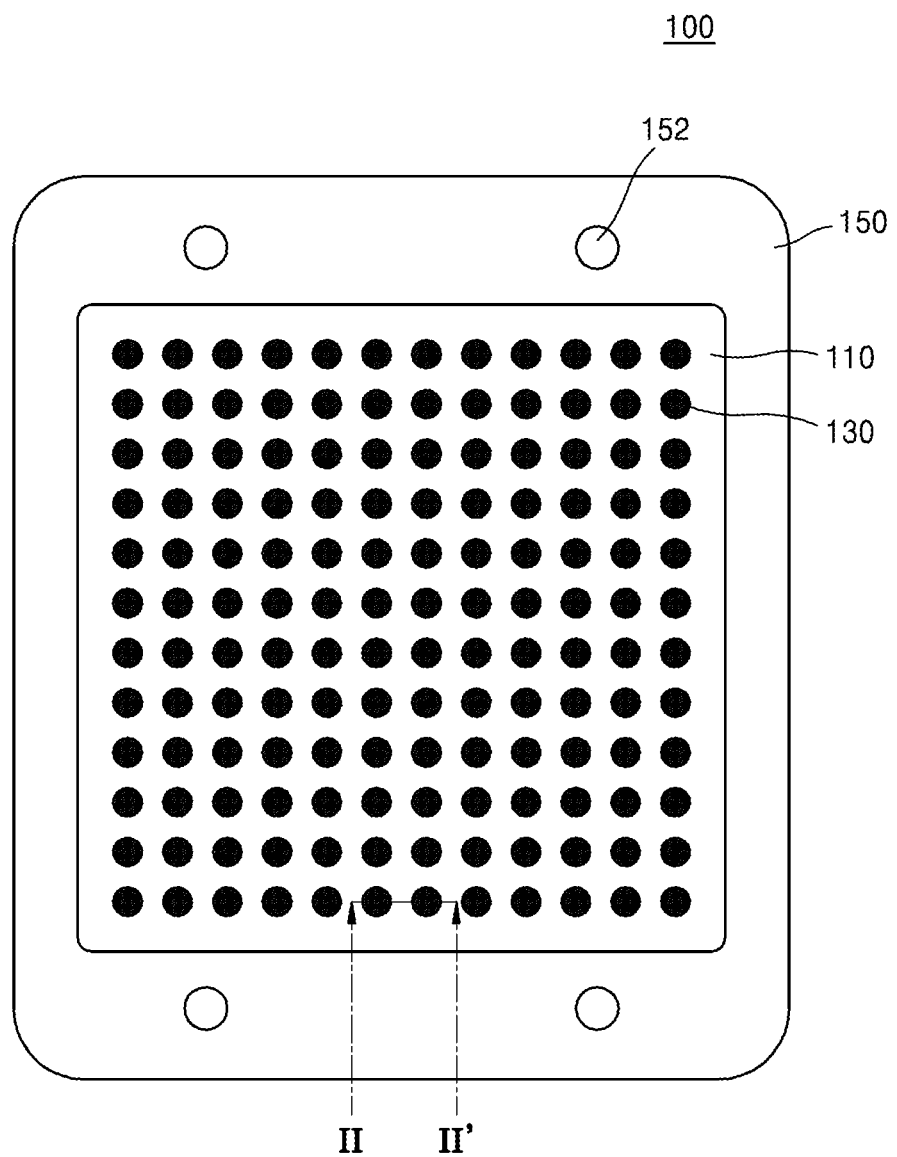
FIG. 1 is a plan view of a test socket according to some example embodiments of the inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
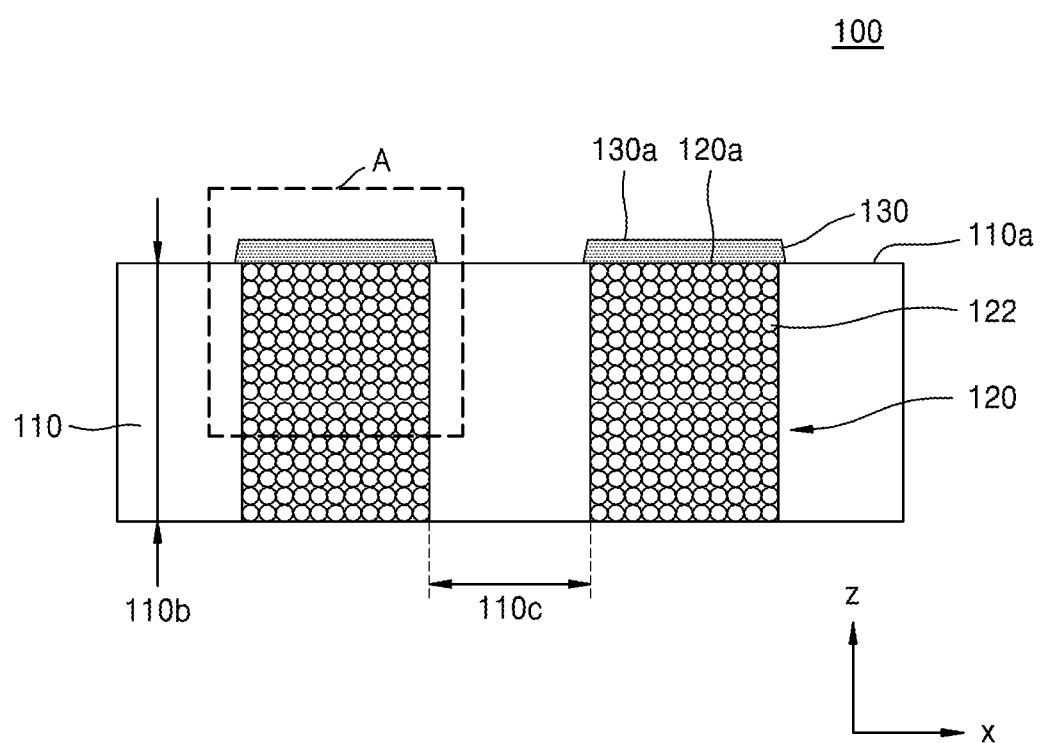
FIG. 2 is a cross-sectional view of the test socket, taken along line □-□' of FIG. 1.
Figure 3:
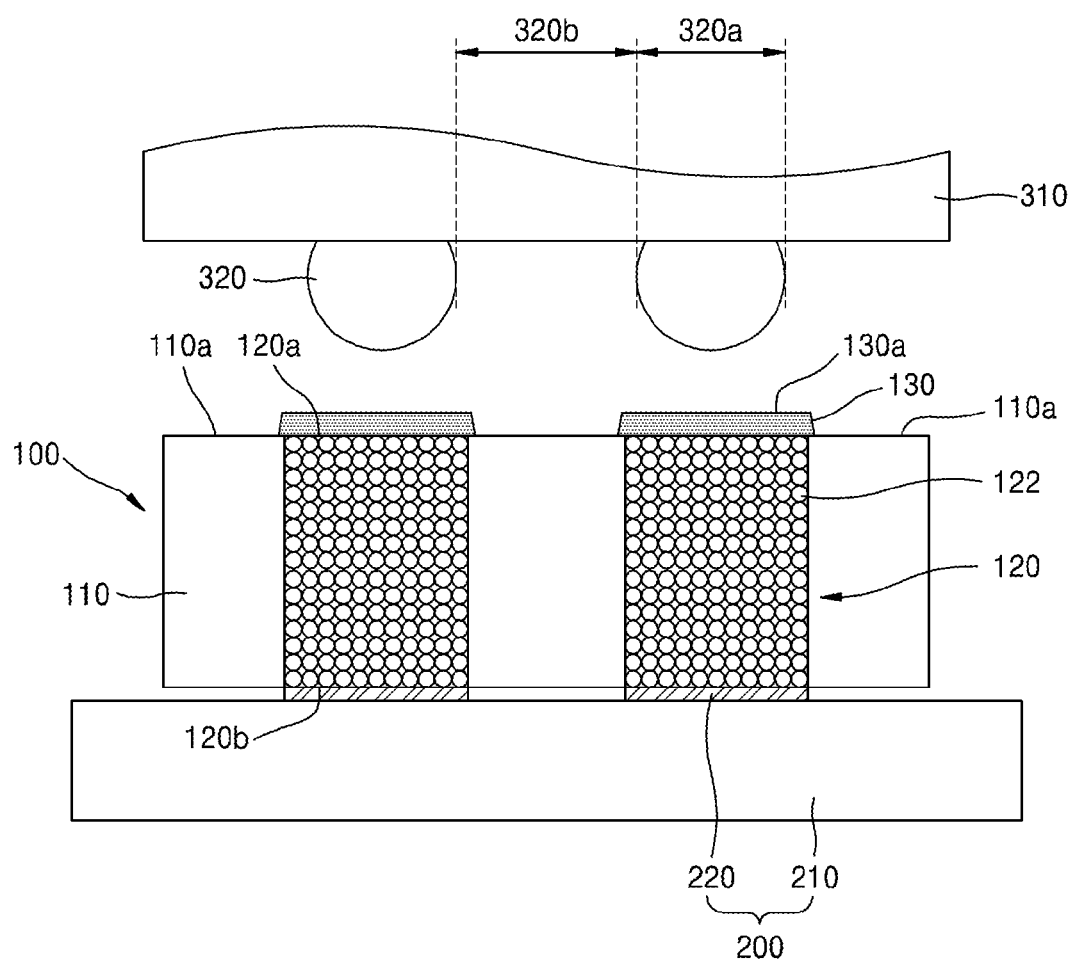
FIG. 3 illustrates a method of testing a semiconductor package by using a test socket according to some example embodiments of the inventive concepts.

FIG. 1 is a plan view of a test socket 100 according to some example embodiments of the inventive concepts. FIG. 2 is a cross-sectional view of the test socket 100, taken along line II-II' of FIG. 1. FIG. 3 illustrates a method of testing a semiconductor package by using the test socket 100.

Referring to FIGS. 1 to 3, the test socket 100 may be a test socket for testing a semiconductor package 310, and the test socket 100 may be between the semiconductor package 310 and a test substrate 210 and may provide electrical connection between the semiconductor package 310 and the test substrate 210. A test substrate 210 may be included in a test device 200.

The test socket 100 may include a base material 110, a first conductive portion 120, a second conductive portion 130, and a frame 150. The one or more first conductive portions 120 and second conductive portions 130 may each be arranged in configurations that correspond to a configuration of a plurality of connection terminals 320 provided on a side of the semiconductor package 310. For example, a quantity of first conductive portions 120 and second conductive portions 130 may correspond to a quantity of connection terminals 320 on the semiconductor package 310. An arrangement of the first and second conductive portions 120 and 130 may correspond to an arrangement of the connection terminals 320 on the semiconductor packages 310.

The base material 110 may surround the plurality of first conductive portions 120 and may include an elastic material. Contact pressure that decreases a thickness of the base material 110 from an original thickness by about 10 to 30% from the top of the base material 110 may be applied to the base material 110. The base material 110 may return to the original thickness after the contact pressure is removed, based at least in part upon the elastic material included in the base material 110.

In some example embodiments, the base material 110 may include an insulating material having elasticity. For example, the base material 110 may include at least one of silicone rubber, butadiene-based rubber, and acrylate-based rubber. However, a type of the base material 110 is not limited thereto.

As shown in the example embodiments illustrated in FIG. 3, the first conductive portions 120 may be arranged in an arrangement corresponding to the arrangement of connection terminals 320 of the semiconductor package 310. The first conductive portions 120 may extend through the test socket 100 in a thickness direction of the base material 110. The first conductive portions 120 may be surrounded by the base material 110, and the top surface of each of the first conductive portions 120 may be at the same level as the top surface of the base material 110.

In some example embodiments, the first conductive portions 120 may further extend beyond the base material 110, and the top surface of each of the first conductive portions 120 may be at a higher level (e.g., elevated above) the top surface 110a of the base material 110. For example, a height of the first conductive portions 120 in the z direction of FIG. 2 (e.g., the thickness direction of the base material 110) may be greater than a thickness 110b of the base material 110 in the z direction.

Each of the first conductive portions 120 may be spaced apart from a neighboring first conductive portion 120 by a desired (or, alternatively, predetermined) distance 110c. The desired (or, alternatively, predetermined) distance may be substantially the same as a distance between the connection terminals 320 of the semiconductor package 310. When the sum of the distance between the connection terminals 320 and a width of a connection terminal 320 is referred to as a pitch, each of the first conductive portions 120 may have substantially the same pitch as the semiconductor package 310. Accordingly, as the pitch of the semiconductor package 310 decreases, a distance between the first conductive portions 120 may also decrease.

Each of the first conductive portions 120 may include a plurality of conductive particles 122 arranged in the thickness direction of the base material 110. The conductive particles 122 are connected to one another, and thus, the test socket 100 has electrical conductivity in the z direction of FIG. 2. Since the first conductive portions 120 are separate from one another due to the base material 110, and the base material 110 includes an insulating material, the test socket 100 may display conductive anisotropy that has electrical conductivity in one direction, for example, only in the z direction of FIG. 2.

In some example embodiments, a conductive particle 122 may include at least one material selected from a group including nickel, cobalt, iron, silver, gold, aluminium, platinum, titanium, palladium, and rhodium. However, a material of the conductive particle 122 is not limited thereto.

In some example embodiments, the conductive particle 122 may include a magnetic core particle and a coating layer that includes, on a surface of the core particle, a metal material having high electrical conductivity. For example, the conductive particle 122 may include a core particle that includes nickel and a coating layer that includes gold on a surface of the core particle. Although methods such as chemical plating or electroplating may be used to form the coating layer, a method for forming the coating layer is not limited thereto.

In some example embodiments, the conductive particle 122 may be a regular or atypical particle. Although the conductive particle 122 may have a spherical shape, a plate shape, an oval shape, etc., a shape of the conductive particle 122 is not limited thereto. In this regard, a plate-shaped particle refers to a particle having a plate shape that is wide and flat and has a small thickness. Although the plate-shaped particle has a wide surface having a shape that is at least one of a circle, an oval, and a polygon, a shape of the wide surface is not limited thereto. The plate-shaped particle may be formed by pressing a spherical particle, and in this case, the plate-shaped particle may be processed to have a circular, oval, or irregular shape.

In some example embodiments, the conductive particle 122 may have a diameter of about 10 to about 100 micrometers. However, a diameter of the conductive particle 122 is not limited thereto. Also, when the conductive particle 122 has a plate shape, the conductive particle 122 may have a diameter greater than 100 micrometers (or the maximum length).

The second conductive portion 130 may be provided in a plurality of numbers ("quantities") and may be in a position corresponding to the top of the first conductive portions 120. The second conductive portion 130 may cover at least a portion of the top of the first conductive portion 120. As illustrated in FIG. 2, the second conductive portion 130 may completely cover the top of the first conductive portion 120, or unlike that illustrated in FIG. 2, the second conductive portion 130 may cover a portion of the top of the first conductive portion 120.

The top surface 130a of the second conductive portion 130 may have a greater height level than the top surface 110a of the base material 110. When a height at which the connection terminal 320 of the semiconductor package 310 protrudes from the bottom surface of the semiconductor package 310 is small, the top surface 130a of the second conductive portion 130 may be at a higher level than the top surface 110a of the base material 110, and thus, the second conductive portion 130 and the connection terminal 320 of the semiconductor package 310 may be electrically connected to each other independently of the connection terminal 320 contacting the base material 110.

In some example embodiments, if and/or when the top surface 120a of the first conductive portion 120 is at a lower level than the top surface 110a of the base material 110, the top surface 130a of the second conductive portion 130 may have substantially the same height level as or a lower height level than the top surface 110a of the base material 110.

Each second conductive portion 130 of the plurality of the second conductive portions 130 may be spaced apart from the neighboring second conductive portion 130 by a desired (or, alternatively, predetermined) distance 110c. The desired (or, alternatively, predetermined) distance 110c may be substantially the same as the distance 320b between the connection terminals 320 of the semiconductor package 310. Each of the second conductive portions 130 may have substantially the same pitch as the first conductive portion 120. That is, the pitch of the second conductive portion 130 may be substantially the same as the sum of the distance between the connection terminals 320 and the width 320a of the connection terminal 320. Accordingly, as the pitch of the semiconductor package 310 decreases, a distance 110c between the second conductive portions 130 may also decrease.

Due to factors including a loss of at least some conductive particles 122 from a top portion of the first conductive portion 120, contact between the test socket 100 and the connection terminal 320 of the semiconductor package 310 may degrade. Such contact may be improved by refilling the top portion of the first conductive portion 120 with a conductive material. The conductive material may at least partially comprise the second conductive portion 130. The second conductive portion 130 may increase a contact area between the connection terminal 320 of the semiconductor package 310 and the test socket 100 and thus may decrease contact resistance therebetween.

The second conductive portion 130 may be between the first conductive portion 120 and the connection terminal 320, and the first conductive portion 120 may be separate from the connection terminal 320. Accordingly, the second conductive portion 130 may reduce and/or prevent damage that may occur as a result of direct contact between the first conductive portion 120 and the connection terminal 320. The second conductive portion 130 may reduce and/or prevent the conductive particles 122 of the first conductive portion 120 from leaving (e.g., being lost from) the first conductive portion 120.

The second conductive portion 130 may be formed by printing conductive ink at the top of the first conductive portion 120, such that the second conductive portion at least partially includes conductive ink. The conductive ink may include one or more conductive materials. The second conductive portion 130 may be formed by using printers such as a three-dimensional (3D) printer, an inkjet printer, or a screen printer to print the conductive ink at the top of the first conductive portion 120. In some example embodiments, the second conductive portion 130 may be formed by using a dispenser to dispense conductive ink at the top of the first conductive portion 120.

The conductive ink may include conductive materials including one or more of silver, gold, platinum, palladium, copper, nickel, and a combination thereof, and a binder that allows the conductive ink to have conductivity by connecting the conductive materials to each other and may assign physicochemical stability to the conductive ink.

The conductive materials included in the second conductive portion 130 may include the same materials as or different materials from the conductive particles 122 of the first conductive portion 120.

The frame 150 may surround the base material 110. The frame 150 may include openings 152 for combining the test socket 100 and the test substrate 210 provided below the test socket 100 to each other, and the openings 152 may accommodate a mechanical engaging tool such as a bolt. However, a shape of the frame 150 is not limited to the shape illustrated in FIG. 1 and may have various modifications according to a shape of the semiconductor package 310, layout of the connection terminals 320 of the semiconductor package 310, or configuration of the test substrate 210 on which the test socket 100 is to be mounted.

Referring to FIG. 3, the test socket 100 and the test substrate 210 are provided for a test of the semiconductor package 310. The test socket 100 may be between the semiconductor package 310 and the test substrate 210 and may electrically connect the semiconductor package 310 and the test substrate 210 to each other.

The test substrate 210 may be provided below the test socket 100 and may include a plurality of test terminals 220 in a position corresponding to the first conductive portions 120 of the test socket 100. The test terminals 220 may contact the bottom surface 120b of the first conductive portions 120.

The semiconductor package 310 may be connected to the test socket 100 in an opposite direction to the test substrate 210. The semiconductor package 310 may include the connection terminals 320 arranged on a surface of the semiconductor package 310. The connection terminals 320 may be, for example, solder balls. The first conductive portions 120 may be arranged in a configuration corresponding to the configuration of connection terminals 320 on the semiconductor package. Although the semiconductor package 310 may be of a ball grid array (BGA) type, a type of the semiconductor package 310 is not limited thereto.

While the test is performed, the semiconductor package 310 may be provided above the test socket 100 to apply constant pressure to the test socket 100. The connection terminals 320 of the semiconductor package 310 may contact the second conductive portions 130 and/or the first conductive portions 120 of the test socket 100 and thus are electrically connected thereto, and the base material 110 having desired (or, alternatively, predetermined) elasticity has thickness decreased by the pressure applied by the semiconductor package 310.

While the test is performed on the semiconductor package 310, the connection terminals 320 of the semiconductor package 310 may be electrically connected to the test terminals 220 of the test substrate 210 via the second conductive portions 130 and the first conductive portions 120. A test system connected to the test substrate 210 tests performance, current flow, and the like of the semiconductor package 310.

Figure 4:
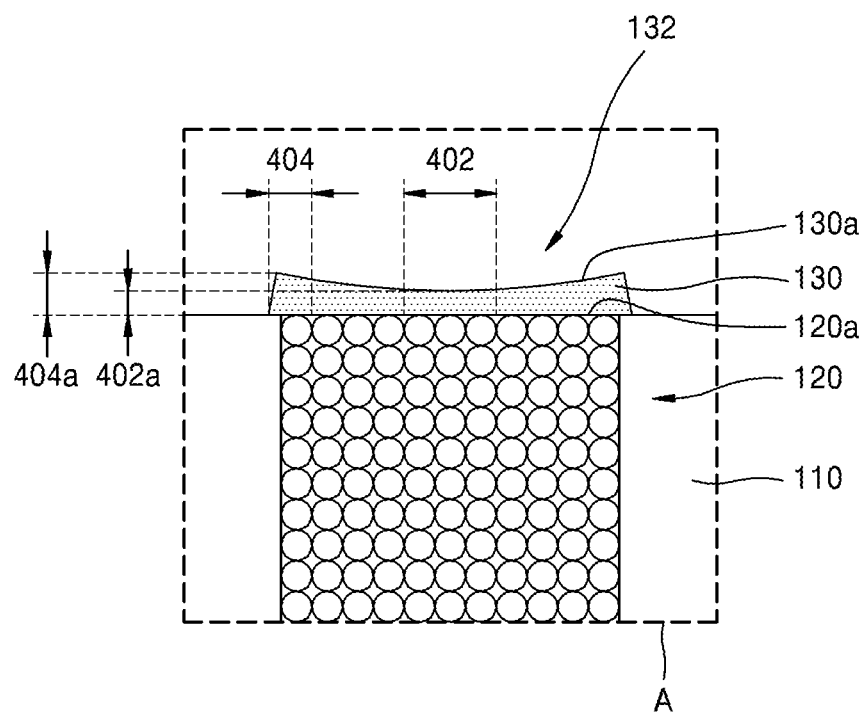
FIG. 4 and FIG. 5 illustrate area A of FIG. 2 in order to describe a test socket according to some example embodiments of the inventive concepts.
Figure 5:
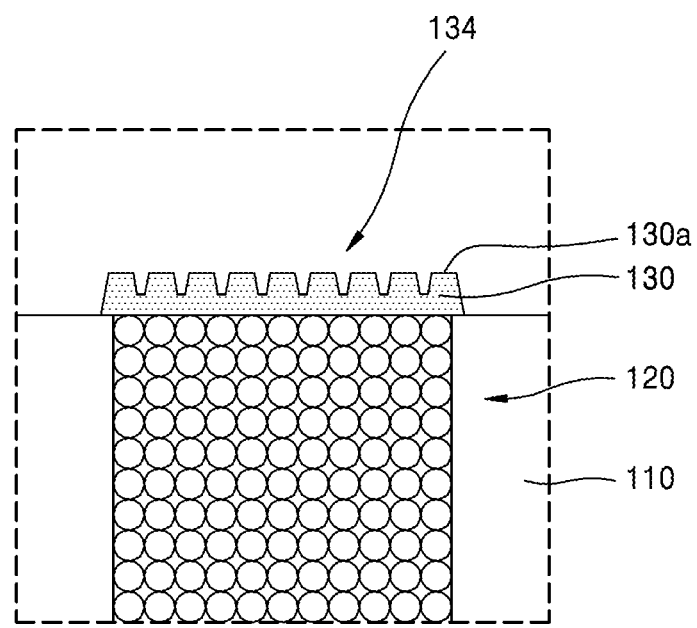

FIG. 4 and FIG. 5 illustrate area A of FIG. 2 in order to describe a test socket according to some example embodiments of the inventive concepts.

Referring to FIG. 4, the top surface 130a of the second conductive portion 130 may include a concave portion 132. That is, the top surface 130a of the second conductive portion 130 may have a lower height 402a in the central portion 402 than the heights 404a of the second conductive portion 130 in edge portions 404. For example, the concave portion 132 may be provided in order to decrease contact resistance by increasing a contact area between the connection terminal 320 having a convex surface that faces the second conductive portion 130 and the second conductive portion 130.

The second conductive portion 130 may be at least partially formed of conductive ink printed on at least the top surface 120a of the first conductive portion 120. In some example embodiments, the second conductive portion 130 including the concave portion 132 may be formed by using a 3D printer. By using the 3D printer, a solid shape such as a second conductive portion 132 that includes the concave portion 132 may be formed from conductive ink, and a process time for forming the second conductive portion 130 may also be decreased.

Referring to FIG. 5, the top surface 130a of the second conductive portion 130 may include an uneven portion 134. While a test is performed, a connection terminal (320 of FIG. 3) may contact an uneven pattern of second conductive portions 130 on the test socket 100, and the uneven portions 134 of one or more second conductive portions 130 may allow the connection terminal 320 and the second conductive portion 130 to stably contact each other.

In some example embodiments, the second conductive portion 130 including the uneven portion 134 may be formed by using a 3D printer. By using the 3D printer, the uneven pattern may be formed rapidly.

Referring to FIGS. 4 and 5, the top surface 130a of the second conductive portion 130 may include both of the concave portion 132 and the uneven portion 134. That is, the top of the second conductive portion 130 may have a lower height level in the central portion 402 than in edge portions 404 and may also include an uneven pattern 134.

Figure 6A:
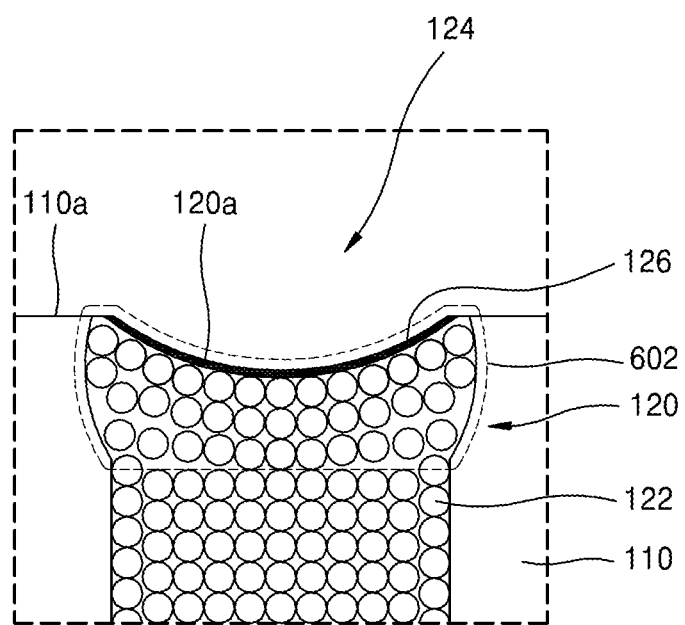
FIG. 6A, FIG. 6B, and FIG. 6C illustrate area A of FIG. 2, according to some example embodiments of the inventive concepts.
Figure 6B:
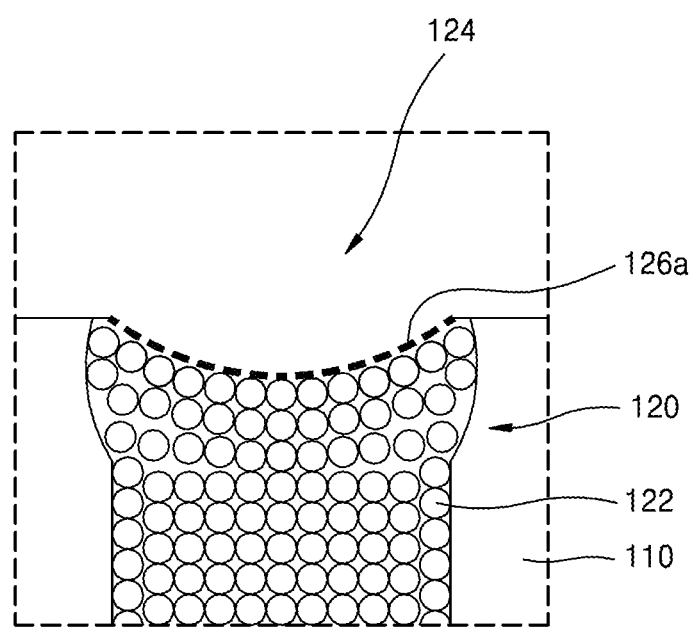
Figure 6C:
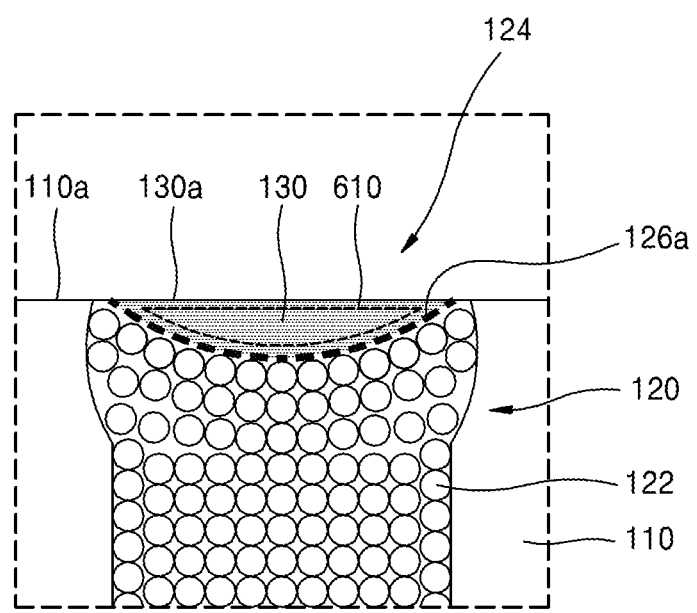

FIG. 6A, FIG. 6B, and FIG. 6C illustrate area A of FIG. 2, according to some example embodiments of the inventive concepts.

Referring to FIG. 6A, a test socket 100 on which one or more tests are performed may be provided. A test may include contacting a first or second conductive portion 120, 130 of the test socket 100 with one or more connection terminals 320 of one or more semiconductor packages 310. Due to the implementation of multiple tests, the conductive particles 122 may leave (be lost from) a top portion 602 of the first conductive portion 120. As a result, the top portion 602 of the first conductive portion 120 may include a depression 124 having the central portion depressed, such that the top surface 120a of the first conductive portion is depressed, relative to the top surface 110a of the base material 110. Also, a damaged portion 126 on which particles, foreign materials, or the like are accumulated may be formed on a surface of the first conductive portion 120 where the depression 124 is formed, and the damaged portion 126 may decrease conductivity of the first conductive portion 120 or may interfere with electrical connections between the first conductive portion 120 and a connection terminal 320 of a semiconductor package 310.

During a process of testing a semiconductor package 310 by using a test socket 100, in order to decrease contact resistance between the test socket 100 and the semiconductor package 310 and provide sufficient electrical connection between the test socket 100 and the semiconductor package 310, a stroke, for example, contact pressure, may be applied to the base material 110 in a direction from the semiconductor package 310 to the test socket 100. In general, the stroke may compress the base material 110 such that the thickness of the base material 110 is reduced by about 10 to 30%. After a test of the semiconductor package 310 is completed, the stroke may be removed, and the base material 110 may return to the original thickness due to elastic force. However, when such a test is repeated over multiple tests, the conductive particles 122 arranged in one direction in the base material 110 may be separated ("lost") from the base material 110 due to relatively weak binding strength of the conductive particles 122 with the base material 110 and thus may be out of place. The conductive particles 122 that are out of place may contaminate or damage a connection terminal 320 of the semiconductor package 310. Also, the test socket 100 having the conductive particles 122 out of place may have increased resistance or decreased conductivity in an extension direction of the conductive particles 122 and thus may not serve as a test socket 100.

Referring to FIG. 6B, cleaning may be performed on a damaged portion 126a on the top of the first conductive portion 120. The cleaning may be performed on a test socket 100 used in a plurality of tests in order to reuse the test socket 100 by removing a contaminated material remaining in the test socket 100 or remove a contaminate material before refilling with a second conductive portion (130 of FIG. 6C).

The test socket 100 may be cleaned, for example, by absorbing and removing a contaminated material with an absorptive pad or by applying an irradiating laser beam on a contaminated portion and removing a contaminate material. However, a method of cleaning the test socket is not limited thereto.

By cleaning the test socket 100, the damaged portion 126a on the top of the first conductive portion 120 is decreased compared to that of FIG. 6A. That is, by cleaning a test socket 100 that has already been used, conductivity of the test socket 100 may be reduced and/or prevented from decreasing due to foreign materials or the like, and conductivity decrease of the test socket due to the presence of foreign materials on an interface between the second conductive portion (130 of FIG. 6C) to be formed on the first conductive portion 120 and the first conductive portion 120 may also be reduced and/or prevented.

Referring to FIG. 6C, the second conductive portion 130 may be formed on the first conductive portion 120 by printing conductive ink 610 on the first conductive portion 120. The second conductive portion 130 may cover at least a portion of the top portion of the first conductive portion 120. The second conductive portion 130 may be between a connection terminal 320 of a semiconductor package 310 and the first conductive portion 120 and may electrically connect the connection terminal 310 and the first conductive portion 120 to each other.

The second conductive portion 130 may fill the depression 124 having a lower height level than the top surface 110a of the base material 110. As shown in FIG. 6C, the second conductive portion 130 may have substantially the same height level as the surrounding base material 110, such that top surfaces 130a and 110a are coplanar or substantially coplanar.

In some example embodiments, the top surface 130a of the second conductive portion 130 may have a higher height level than the top surface of the base material 110, and when a height at which a connection terminal of a semiconductor package protrudes from the bottom surface of the semiconductor package is small, the connection terminal 320 and the second conductive portion 130 may be electrically connected to each other easily.

In some example embodiments, the top surface 130*a* of the second conductive portion 130 may have a lower height level than the top surface 110*a* of the base material 110, and the second conductive portion 130 may be a film that covers a surface of the depression 124.

In some example embodiments, the second conductive portion 130 may be formed by printing conductive ink using printers such as a 3D printer, an inkjet printer, or a screen printer or by dispensing conductive ink using a dispenser.

Through the process of FIGS. 6A to 6C, a test socket whose life is ended due to factors such as loss of the conductive particles 122 from the first conductive portion 120 may be reused. Considering that test sockets 100 are high price consumables, a test socket 100 whose life is ended may be reused by using a printing method that costs relatively less compared to replacing the test socket 100 with a new socket, and thus, process costs may be decreased. Also, the process of cleaning a test socket 100 and the process of forming the second conductive portion 130 may be repeated, and a reused test socket 100 may be used again through the processes.

Figure 7:
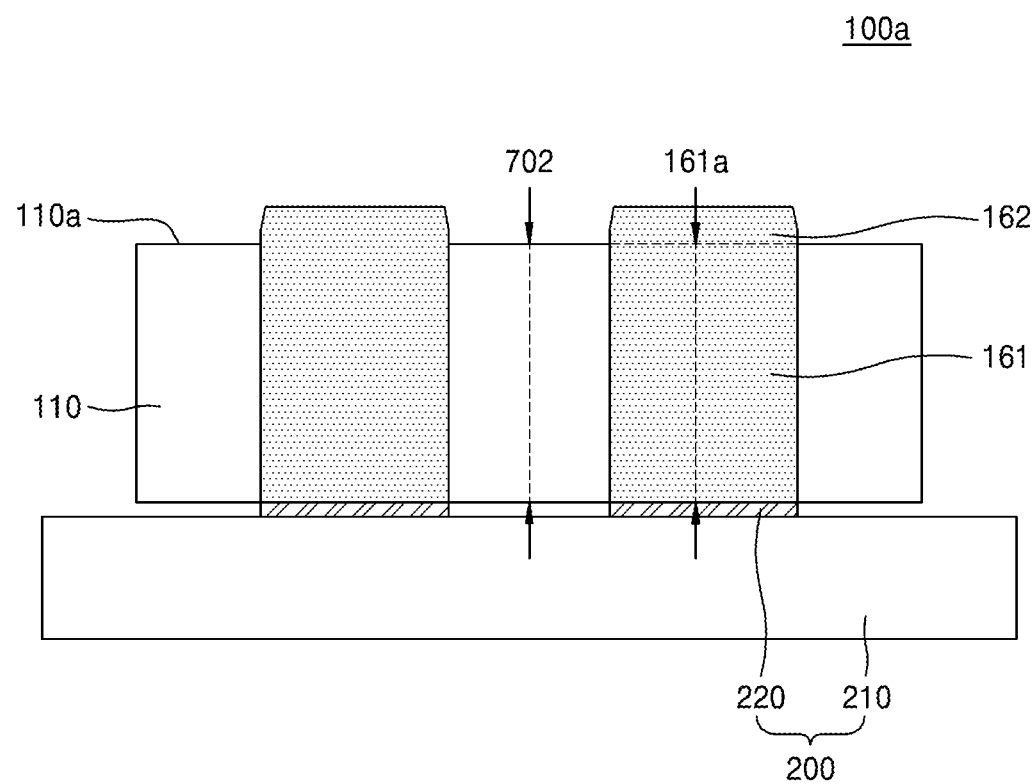
FIG. 7 is a cross-sectional view of a test socket according to some example embodiments of the inventive concepts.

FIG. 7 is a cross-sectional view of a test socket 100*a* according to some example embodiments of the inventive concepts.

Referring to FIG. 7, the test socket 100*a* may include the base material 110, a first conductive portion 161, and a second conductive portion 162. In FIG. 7, elements that are substantially the same as those in FIG. 2 are designated by the same reference numerals, and a repeated description thereof is omitted or simplified.

The base material 110 may form the entire appearance of the test socket 100*a* and may include a material that has a desired (or, alternatively, predetermined) elasticity. The base material 110 may surround the first conductive portion 161 provided in a plurality of numbers (e.g., a quantity of first conductive portions 161).

The first conductive material 161 provided in a plurality of numbers may be arranged in a position corresponding to connection terminals of a semiconductor package to be tested and may extend in a thickness direction of the base material 110. A height level 161*a* of the first conductive portion 161 may be the same as or higher than a height level 702 of the surrounding base material 110.

As shown in FIG. 7, the second conductive portion 162 may be formed in a position corresponding to the top of the first conductive portion 161. The first conductive portion 161 and the second conductive portion 162 may provide electrical paths between the test terminals 220 of the test substrate 210 provided below the test socket 100*a* and connection terminals (320 of FIG. 3) of a semiconductor package 310 provided above the test socket 100*a*.

In some example embodiments, the first conductive portion 161 and the second conductive portion 162 may be integrally formed with each other, and the first conductive portion 161 and the second conductive portion 162 may be formed by directly printing conductive ink on the test substrate 210 disposed below the test socket 100*a*. Such a printing process may be performed by using a 3D printer. For example, a first and second conductive portion 161, 162 may be formed as an individual structure, as shown in FIG. 7. The individual structure may be formed of conductive ink.

A boundary between adjacent first and second conductive portions 161, 162 in a common structure may be defined by a plane corresponding to the top surface 110*a* of the base material 110, as shown in FIG. 7.

In this regard, the conductive ink used to form the first conductive portions 161 and the second conductive portion 162 may include a metal material having desired (or, alternatively, predetermined) elasticity and viscosity.

In some example embodiments, the second conductive portion 162 may be formed to reuse the test socket 100*a* having contact weakened during several tests. That is, when contact between the first conductive portion 161 and the connection terminal of a semiconductor package weakens as the top of the first conductive portion 161 is depressed, contaminated, degraded, ablated, some combination thereof, or the like due to several tests, the second conductive portion 162 may be formed by printing conductive ink on the first conductive portion 161, and thus, the test socket 100*a* may be reused. When the second conductive portion 162 is used in "refilling" to reuse a test socket 100*a*, the second conductive portion 162 may include the same material as the first conductive portion 161 or may include a different material from the first conductive portion 161.

Figure 8:
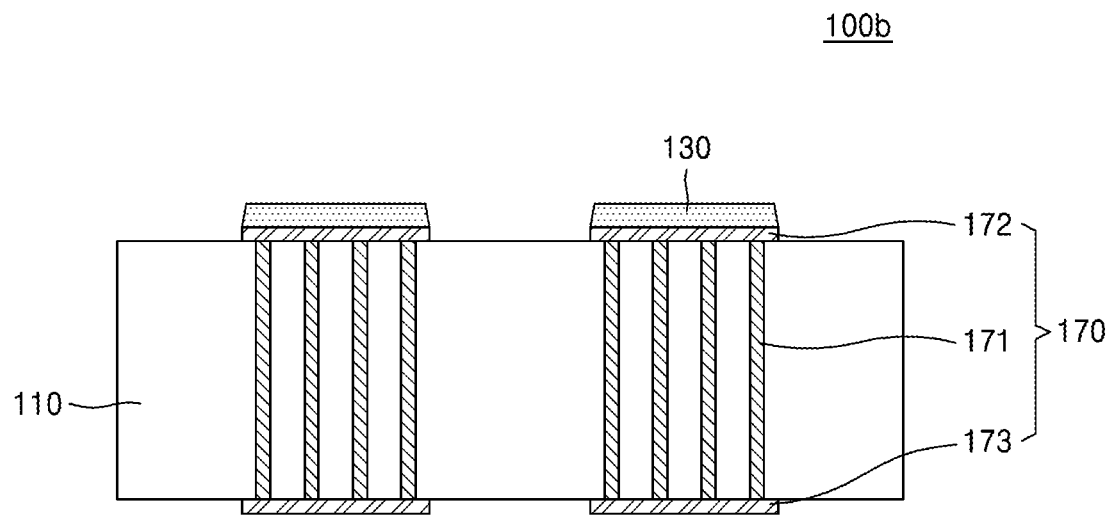
FIG. 8 is a cross-sectional view of a test socket according to some example embodiments of the inventive concepts.

FIG. 8 is a cross-sectional view of a test socket 100*b* according to some example embodiments of the inventive concepts.

Referring to FIG. 8, the test socket 100*b* may include the base material 110, a first conductive portion 170, and the second conductive portion 130. The test socket 100*b* may be a wire test socket including a conductive wire 171. In FIG. 8, elements that are substantially the same as those in FIG. 2 are designated by the same reference numerals, and a repeated description thereof is omitted or simplified.

The base material 110 may form the entire appearance of the test socket 100*b* and may include a material that has desired (or, alternatively, predetermined) elasticity. The base material 110 may surround the first conductive portion 170 provided in a plurality of numbers.

The first conductive portion 170 may include an upper pad 172, a lower pad 173, and the conductive wire 171 electrically connecting the upper pad 172 and the lower pad 173 to each other.

The upper pad 172 provided in a plurality of numbers may be separate from each other on the base material 110 and may be arranged in a position corresponding to connection terminals of a semiconductor package to be tested. Also, the lower pad 173 provided in a plurality of numbers may be separate from each other under the base material 110 and may be arranged in a position corresponding to test terminals of a test substrate. The conductive wire 171 may connect the upper pad 172 and the lower pad 173 to each other and thus electrically connect the upper pad 172 and the lower pad 173 to each other.

The second conductive portion 130 may be formed in a position corresponding to the upper pad 172 and may cover at least a portion of the top of the upper pad 172. The second conductive portion 130 may be formed by printing conductive ink on the upper pad 172. In order to form the second conductive portion 130, printers such as a 3D printer, an inkjet printer, or a screen printer may be used.

The second conductive portion 130 may be between a connection terminal of a semiconductor package and the first conductive portion 170 and may electrically connect the connection terminal and the first conductive portion 170. The second conductive portion 130 may reduce and/or prevent the first conductive portion 170 from directly contacting the connection terminal and thus may reduce and/or prevent the top of the first conductive portion 170 from being depressed or contaminated.

In some example embodiments, the second conductive portion 130 may be formed to reuse the test socket 100b having contact weakened during several times of tests. That is, when contact between the first conductive portion 170 and a connection terminal of a semiconductor package weakens as the top of the first conductive portion 170 is depressed, contaminated, or the like due to several times of tests, the second conductive portion 130 may be formed on the first conductive portion 170 by printing conductive ink, and thus, the test socket 100b may be reused.

Figure 9:
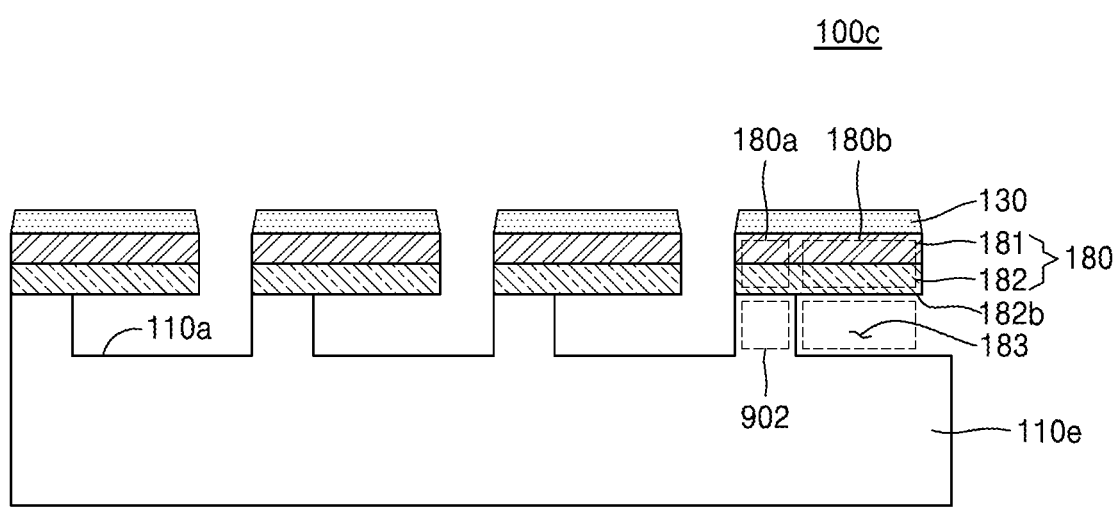
FIG. 9 is a cross-sectional view of a test socket according to some example embodiments of the inventive concepts.

FIG. 9 is a cross-sectional view of a test socket 100c according to some example embodiments of the inventive concepts.

Referring to FIG. 9, the test socket 100c may include a base material 110e, a first conductive portion 180, and the second conductive portion 130. The test socket 100c may be a microelectromechanical systems (MEMS) type test socket manufactured by using MEMS technology. In FIG. 9, elements that are substantially the same as those in FIG. 2 are designated by the same reference numerals, and a repeated description thereof is omitted or simplified.

The base material 110e may include an insulator, for example, ceramic, reinforced, plastic, glass, complex epoxy resin, a reinforced polymer compound, reinforced acrylic resin, reinforced polyester, etc., or may include metal formed as an insulated film. Also, the base material 110e may have a buffer layer under the base material 110e, the buffer layer doing buffering action. The buffer layer may include various types of synthetic rubber and resin.

The first conductive portion 180 may include a first layer 182 on the base material 110e and a second layer 181 on the first layer 182. The first layer 182 may include a silicon epi-layer. The second layer 181 may include conductive metal. Although not illustrated in FIG. 9, a penetrating hole that passes through the base material 110e vertically may be formed, and the second layer 181 may be electrically connected to a test terminal of a test substrate that may be disposed below the test socket 100c by using a conductive material filled in the penetrating hole.

A cavity 183 that has a desired (or, alternatively, predetermined) depth may be formed in a plurality of numbers ("quantities") on the top surface 110a of the base material 110e, and the first conductive portion 180 may partially cover an upper side of the cavity 183. Thus, the first conductive portion 180 may at least partially define the cavity 183 between the top surface 110a of the base material 110e and a bottom surface 182b of the first conductive portion 180. Only an edge portion 180a of the first conductive portion 180 may be supported by a portion 902 the base material 110e, and thus, another edge portion 180b of the first conductive portion 180 that is not supported by the portion 902 of the base material 110e may be configured to move up and down. Although the cavity 183 may be empty space as illustrated in FIG. 9, alternatively, an elastic material including various types of synthetic rubber, resin or springs may be filled in the cavity 183.

The second conductive portion 130 may be formed in a position corresponding to the top of the second layer 181 and may cover at least a portion of the top of the second layer 181. The second conductive portion 130 may be formed by printing conductive ink on the second layer 181. Printers such as a 3D printer, an inkjet printer, or a screen printer may be used to form the second conductive portion 130.

The second conductive portion 130 may be between a connection terminal of a semiconductor package and the first conductive portion 180 and may electrically connect the connection terminal and the first conductive portion 180 to each other. Also, the second conductive portion 180 may reduce and/or prevent the first conductive portion 180 from directly contacting the connection terminal and thus may reduce and/or prevent the top of the first conductive portion 180 from being depressed or contaminated.

In some example embodiments, the second conductive portion 130 may be formed to reuse the test socket 100c having contact weakened during several times of tests. That is, when contact between the first conductive portion 180 and a connection terminal of a semiconductor package weakens as the top of the first conductive portion 180 is depressed, contaminated, or the like due to several times of tests, the second conductive portion 130 may be formed on the first conductive portion 180 by printing conductive ink, and thus, the test socket 100c may be reused.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of manufacturing a test socket, the method comprising:
   preparing the test socket, the test socket including a base material and a first conductive portion in the base material, the first conductive portion extending in a thickness direction of the base material; and
   forming a second conductive portion with a top surface including a concave portion spanning a width of the first conductive portion and upwardly curving continuously across the width of the first conductive portion by printing conductive ink on the first conductive portion.

2. The method of claim 1, wherein,
   the first conductive portion includes a top surface,
   the top surface of the first conductive portion includes a surface depression, and
   the method further includes forming the second conductive portion based on filling the surface depression with the conductive ink.

3. The method of claim 2, further comprising:
   cleaning the top surface of the first conductive portion prior to forming the second conductive portion on the first conductive portion.

4. The method of claim 1, wherein the top surface of the second conductive portion includes an uneven portion.

5. The method of claim 1, further comprising:
   forming the second conductive portion based on operating a three-dimensional (3D) printer.

6. The method of claim 1, further comprising:
   forming the second conductive portion such that the top surface of the second conductive portion is elevated relative to a top surface of the base material.

7. The method of claim 1, wherein,
   the base material includes an insulating elastic material, and
   the first conductive portion includes a plurality of conductive particles, the plurality of conductive particles being configured to display conductivity in the thickness direction of the base material.

8. The method of claim 1, further comprising:
forming the first conductive portion based on printing conductive ink on the base material.

9. The method of claim 1, wherein the first conductive portion includes,
an upper pad on an upper surface of the base material,
a lower pad on a lower surface of the base material, and
a conductive wire penetrating the base material, the conductive wire connected to the upper pad and the lower pad, such that the upper pad and the lower pad are electrically connected through the conductive wire, and
wherein the second conductive portion covers at least a portion of the upper pad.

10. A method of testing a semiconductor package, the method comprising:
preparing a test socket, the test socket including a base material and a first conductive portion in the base material, the base material including an insulating elastic material, the first conductive portion extending in a thickness direction of the base material;
forming a second conductive portion including conductive ink on the first conductive portion, wherein the second conductive portion has a top surface including a concave portion spanning a width of the first conductive portion and upwardly curving continuously across the width of the first conductive portion;
placing the test socket on a test substrate; and
placing the semiconductor package on the test socket such that a connection terminal of the semiconductor package contacts at least a portion of the second conductive portion.

11. The method of claim 10, wherein,
the second conductive portion is between the connection terminal and the first conductive portion, and
the second conductive portion electrically connects the connection terminal and the first conductive portion to each other.

12. The method of claim 10, further comprising:
cleaning a top surface of the first conductive portion before forming the second conductive portion on the first conductive portion.

13. The method of claim 10, wherein forming the second conductive portion includes at least one of,
forming the concave portion in a central area of the top surface of the second conductive portion, and
forming an uneven portion of the top surface of the second conductive portion.

14. The method of claim 13, further comprising:
forming the second conductive portion based on operating a three-dimensional (3D) printer.

15. The method of claim 10, wherein the first conductive portion includes a conductive ink material, such that the first and second conductive portions are integral with each other.

16. A method, comprising:
configuring a test socket to electrically couple a semiconductor package to a test device, the test socket including a base material and a first conductive portion on a top surface of the base material, the first conductive portion at least partially defining a cavity between a bottom surface of the first conductive portion and the top surface of the base material, the configuring including,
forming a second conductive portion with a top surface including a concave portion spanning a width of the first conductive portion and upwardly curving continuously across the width of the first conductive portion by printing conductive ink on a top surface of the first conductive portion.

17. The method of claim 16, further comprising:
cleaning the top surface of the first conductive portion prior to applying the conductive ink on the first conductive portion.

18. The method of claim 16, wherein the top surface of the second conductive portion includes an uneven portion.

* * * * *